United States Patent
Carey et al.

(10) Patent No.: US 8,416,539 B2
(45) Date of Patent: Apr. 9, 2013

(54) MAGNETIC FIELD SENSING SYSTEM USING SPIN-TORQUE DIODE EFFECT

(75) Inventors: Matthew J. Carey, San Jose, CA (US); Jeffrey R. Childress, San Jose, CA (US); Stefan Maat, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 639 days.

(21) Appl. No.: 12/188,183

(22) Filed: Aug. 7, 2008

(65) Prior Publication Data
US 2010/0033881 A1 Feb. 11, 2010

(51) Int. Cl.
G11B 5/33 (2006.01)
G11B 5/127 (2006.01)

(52) U.S. Cl.
USPC ................................................... 360/324.11

(58) Field of Classification Search ............ 360/324.11, 360/324.1
See application file for complete search history.

(56) References Cited

U.S. PATENT DOCUMENTS

| | | | |
|---|---|---|---|
| 5,465,185 A | 11/1995 | Heim et al. | |
| 6,791,868 B2 | 9/2004 | Gider et al. | |
| 7,079,344 B2 | 7/2006 | Nikitin | |
| 7,102,923 B2 | 9/2006 | Hayakawa | |
| 7,203,090 B2 | 4/2007 | Hayakawa | |
| 7,224,601 B2 | 5/2007 | Panchula | |
| 2002/0085323 A1 * | 7/2002 | Smith et al. ............. | 360/324.12 |
| 2007/0159734 A1 | 7/2007 | Nguyen et al. | |
| 2007/0176251 A1 | 8/2007 | Oh et al. | |
| 2007/0253119 A1 | 11/2007 | Carey et al. | |
| 2007/0259209 A1 | 11/2007 | Slavin et al. | |
| 2008/0144232 A1 * | 6/2008 | Kaka et al. ............. | 360/324.1 |
| 2008/0150643 A1 * | 6/2008 | Suzuki et al. ........... | 331/107 R |

FOREIGN PATENT DOCUMENTS

WO  WO 2006/101040 A1 * 9/2006

OTHER PUBLICATIONS

Tanaka et al., "Spin-valve heads in the current-perpendicular-to-plane mode for ultrahigh-density recording", IEEE Transactions on Magnetics, 38 (1): 84-88 Part Jan. 1, 2002.

(Continued)

Primary Examiner — Joseph Haley
Assistant Examiner — Gustavo Polo
(74) Attorney, Agent, or Firm — Thomas R. Berthold

(57) ABSTRACT

A magnetic field sensing system with a current-perpendicular-to-the-plane (CPP) sensor, like that used for giant magnetoresistive (GMR) and tunneling magnetoresistive (TMR) spin-valve (SV) sensors, operates in a mode different from conventional GMR-SV and TMR-SV systems. An alternating-current (AC) source operates at a fixed selected frequency and directs AC perpendicularly through the layers of the CPP sensor, with the AC amplitude being high enough to deliberately induce a spin-torque in the CPP sensor's free layer. The AC-induced spin-torque at the selected frequency causes oscillations in the magnetization of the free layer that give rise to a DC voltage signal $V_{DC}$. $V_{DC}$ is a direct result of only the oscillations induced in the free layer. The value of $V_{DC}$ will change in response to the magnitude of the external magnetic field being sensed and as the free layer is driven in and out of resonance with the AC.

14 Claims, 5 Drawing Sheets

OTHER PUBLICATIONS

Zhu et al., "Spin transfer induced noise in CPP read heads," IEEE Transactions on Magnetics, vol. 40, Jan. 2004, pp. 182-188.

Tulapurkar et al., "Spin-torque diode effect in magnetic tunnel junctions", Nature, vol. 438-17, Nov. 2005, 339-42.

Slonczewski, "Current-driven excitation of magnetic multilayers", JMMM 159, L1-L7 (1996).

Smith et al., "Angular Dependence of Spin Torque Critical Currents for CPP-GMR Read Heads", IEEE Trans. Magn. 41, 2935-2940 (2005).

Zhu et al., "Spin Torque Enhancement o fThermally Excited Ferromagnetic Resonance in Tunneling MR Heads", IEEE Transactions on Magnetics, vol. 42, No. 10, Oct. 2006, pp. 2441-2444.

Smith et al., "Thermal and Spin-Torque Noise in CPP (TMR and/or GMR) Read Sensors", IEEE Transactions on Magnetics, vol. 42, No. 2, Feb. 2006, pp. 114-119.

* cited by examiner

MAGNETIC FIELD SENSING SYSTEM USING SPIN-TORQUE DIODE EFFECT

BACKGROUND OF THE INVENTION

1. Field of the Invention

The invention relates generally to a magnetic field sensing system that uses a current-perpendicular-to-the-plane (CPP) sensor like that used for giant magnetoresistive (GMR) and tunneling magnetoresistive (TMR) spin-valve (SV) sensors, and more particularly to a magnetic field sensing system that operates the CPP sensor in a mode different from conventional GMR-SV and TMR-SV systems.

2. Background of the Invention

Systems for sensing magnetic fields are well-known, including systems for reading of magnetically recorded data from disks in magnetic recording disk drives. One type of disk drive data-reading system uses a conventional magnetoresistive (MR) "spin-valve" (SV) sensor or read head. A SV MR sensor has a stack of layers that includes two ferromagnetic layers separated by a nonmagnetic electrically conductive spacer layer, which is typically copper (Cu). One ferromagnetic layer has its direction of magnetization fixed, such as by being pinned by exchange coupling with an adjacent antiferromagnetic layer, and the other ferromagnetic layer has its direction of magnetization "free" to rotate in the presence of an external magnetic field. With a sense or bias direct current applied to the sensor, the rotation of the free-layer magnetization relative to the fixed-layer magnetization is detectable as a change in electrical resistance.

In a magnetic recording disk drive SV read sensor or head, the stack of layers are located in the read "gap" between magnetic shields. The magnetization of the fixed or pinned layer is generally perpendicular to the plane of the disk, and the magnetization of the free layer is generally parallel to the plane of the disk in the absence of an external magnetic field. When exposed to an external magnetic field from the recorded data on the disk, the free-layer magnetization will rotate, causing a change in electrical resistance. A current-perpendicular-to-the-plane (CPP) SV sensor operates with the sense or bias direct current directed perpendicular to the planes of the layers in the sensor stack. CPP giant magnetoresistive SV read heads are described by A. Tanaka et al., "Spin-valve heads in the current-perpendicular-to-plane mode for ultrahigh-density recording", *IEEE TRANSACTIONS ON MAGNETICS*, 38 (1): 84-88 Part 1 January 2002.

Another type of CPP sensor is a magnetic tunnel junction (MTJ) sensor, also called a tunneling MR or TMR sensor, in which the nonmagnetic spacer layer is a very thin nonmagnetic tunnel barrier layer. In a CPP-TMR sensor the tunneling current perpendicularly through the layers depends on the relative orientation of the magnetizations of the two ferromagnetic layers. While in a CPP-SV read head the spacer layer is formed of an electrically conductive material, such as Cu, in a CPP-TMR read head the spacer layer is formed of an electrically insulating material, such as $TiO_2$, MgO or $Al_2O_3$.

In magnetic field sensing systems with CPP sensors, it is desirable to operate the sensors at a high bias current density to maximize the signal and signal-to-noise ratio (SNR). However, it is known that CPP sensors are susceptible to current-induced noise and instability. The spin-polarized bias current flows perpendicularly through the ferromagnetic layers and produces a spin-torque effect on the local magnetization. This can produce continuous gyrations or excitations of the magnetization, resulting in substantial low-frequency magnetic noise if the bias current is greater than a "critical current" ($I_C$). This effect is described by J.-G. Zhu et al., "Spin transfer induced noise in CPP read heads," *IEEE Transactions on Magnetics*, Vol. 40, January 2004, pp. 182-188. Thus the adverse effect of spin-torque limits the bias current at which the CPP sensors can operate.

What is needed is a magnetic field sensing system, such as the data-reading system in a magnetic recording disk drive, that uses a CPP sensor but that operates in the presence of current-induced spin-torque without adverse effects.

SUMMARY OF THE INVENTION

The invention relates to a magnetic field sensing system with a current-perpendicular-to-the-plane (CPP) sensor, like that used for giant magnetoresistive (GMR) and tunneling magnetoresistive (TMR) spin-valve (SV) sensors, that operates in a mode different from conventional GMR-SV and TMR-SV systems. In a conventional CPP sensor, there is a bias or sense direct current (DC) that is at a level less than the critical current ($I_C$) to assure there is no spin-torque affecting the magnetization of the CPP sensor's free layer, which can create excessive noise. However, in the system according to this invention an alternating-current (AC) source operates at a fixed selected frequency and directs AC perpendicularly through the layers of CPP sensor, with the AC amplitude $I_{AC}$ being high enough to deliberately induce a spin-torque in the CPP sensor's free layer. The AC-induced spin-torque at the selected frequency causes oscillations in the magnetization of the free layer that give rise to a DC voltage signal $V_{DC}$. The resonance frequencies of the free layer and pinned or reference layer are typically far enough apart so that if the AC frequency is selected to be near the resonance frequency of the free layer, there will be no oscillations induced in the pinned layer. Thus the DC voltage signal $V_{DC}$ is a direct result of only the oscillations induced in the free layer. The value of $V_{DC}$ will change in response to the magnitude of the external magnetic field being sensed and as the free layer is driven in and out of resonance with the AC. In the CPP sensor of this invention, the DC voltage resulting from AC-induced spin-torque oscillations of the free layer magnetization represents the actual magnetoresistive signal, whereas in a conventional CPP sensor the DC-induced spin-torque oscillations add noise to the magnetoresistive signal. The resonance frequency of the free layer will change with the magnitude of the external fields, not the sign of the external fields. For this reason, in a disk drive implementation where the magnetic fields being sensed have positive and negative values, an external bias field is required so that the sensor senses the magnetic transitions in the range of zero to about twice the value of the magnetic field from a magnetized region.

In a disk drive embodiment, the sensor may be a CPP GMR-SV type of sensor or a CPP TMR-SV type of sensor. If the sensor is like a TMR-SV sensor wherein the nonmagnetic spacer layer between the free and pinned layers is an insulating tunnel barrier, the magnetizations of the free and pinned layers are oriented generally orthogonal to one another in the absence of an external magnetic field. If the sensor is like a GMR-SV wherein the nonmagnetic spacer layer is an electrically conductive layer, the magnetizations of the free and pinned layers are generally oriented more antiparallel than parallel to each other. In either case, the magnetization of the free layer is oriented generally perpendicular to the surface of the disk.

Because it is necessary that the sensor operates at current levels above $I_C$ to induce the spin-torque effect in the free layer, the properties of the materials used for the free layer in the sensor can be chosen to reduce $I_C$, and thus reduce the level of current that needs to be supplied by the AC source.

One class of materials for the free layer are high spin-polarization materials because they will decrease $I_C$. Thus the free layer may be formed of or comprise a ferromagnetic Heusler alloy, some of which are known to exhibit high spin-polarization in their bulk form. Full and half Heusler alloys are intermetallics with particular composition and crystal structure. Examples of Heusler alloys include but are not limited to the full Heusler alloys $Co_2MnX$ (where X is one or more of Al, Sb, Si, Sn, Ga, or Ge), $Co_2FeSi$, and $Co_2Fe_xCr_{(1-x)}Al$ (where x is between 0 and 1). Examples also include but are not limited to the half Heusler alloys NiMnSb, and PtMnSb. Another class of materials for the free layer are those with short spin-diffusion length comparable to the thickness of a typical free layer. Similar to materials with high spin-polarization, they are effective in scattering spins over a short length scale and thus induce spin-torque instabilities. One such preferred material has a composition of $(Co_xFe_{100-x})_{(100-y)}M_y$, where M is an element selected from the group consisting of Al, Ge and Si and where x is between about 40 and 60 and y is between about 20 and 40. Still another class of materials are those with low magnetic damping, such as permalloy ($NiFe_{19}$). Generally, materials that exhibit a high spin-polarization and low damping are desirable for the sensor of this invention since these properties reduce $I_C$.

For a fuller understanding of the nature and advantages of the present invention, reference should be made to the following detailed description taken together with the accompanying figures.

DETAILED DESCRIPTION OF THE INVENTION

Figure 1:
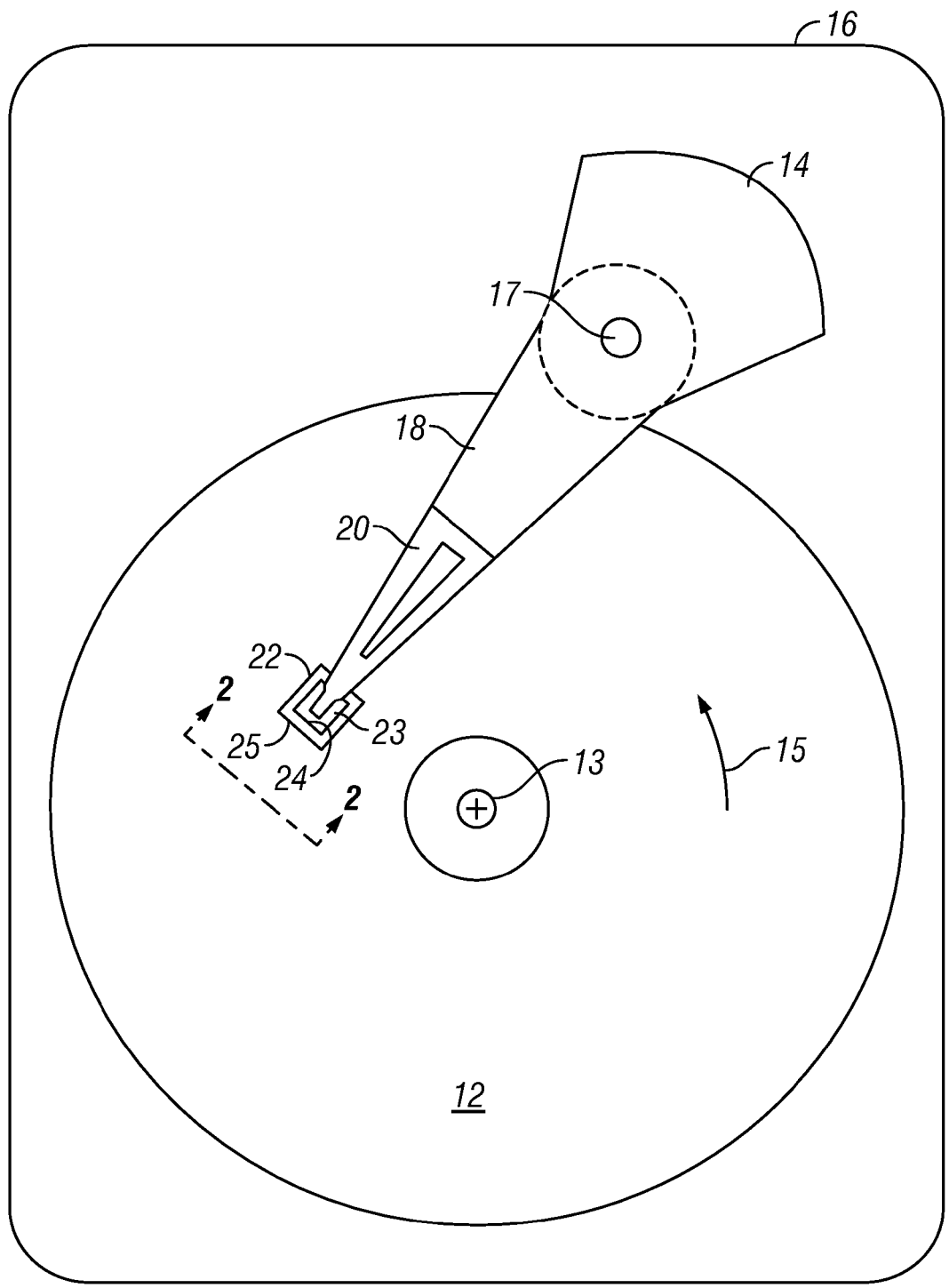
FIG. 1 is a schematic top view of a conventional magnetic recording hard disk drive with the cover removed.

FIGS. 1-4 illustrate a conventional CPP magnetoresistive (MR) magnetic field sensing sensor and system. FIG. 1 is a block diagram of a conventional magnetic recording hard disk drive with a data-reading system that uses a conventional CPP magnetoresistive (MR) sensor. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
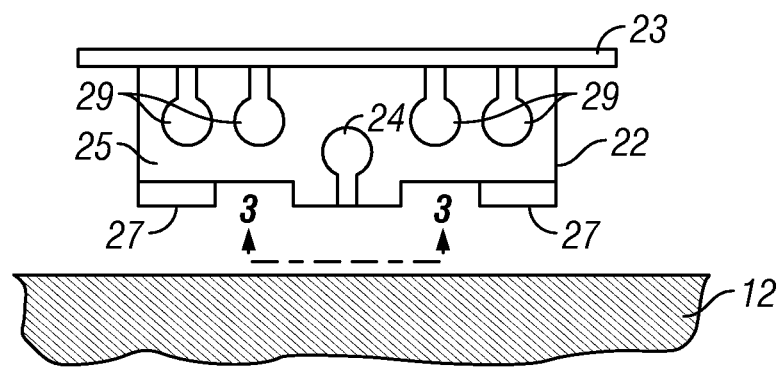
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 22 in very close proximity to or near contact with the surface of disk 12. The read/write head 24 is formed on the trailing surface 25 and is connected to the disk drive read/write electronics by electrical connection to terminal pads 29 on the trailing surface 25.

Figure 3:
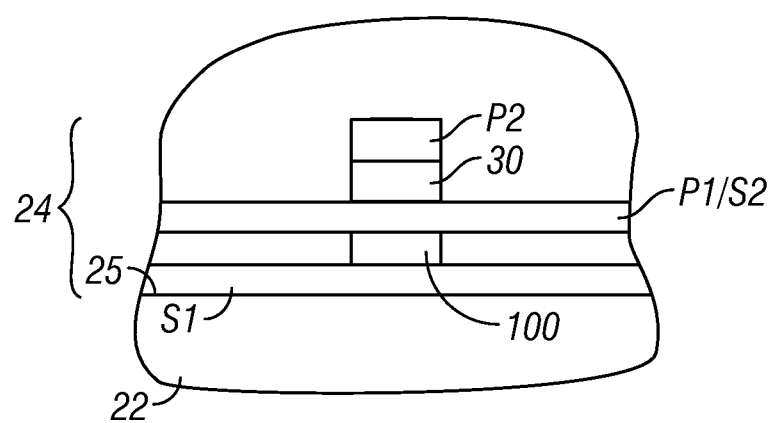
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes magnetic write poles P1/S2 and P1 separated by a write gap 30. The CPP MR sensor or read head 100 is located between two magnetic shields S1 and P1/S2, with P1/S2 also serving as the first write pole for the write head. The shields S1, S2 are formed of magnetically permeable material and are electrically conductive so they can function as the electrical leads to the read head 100. Separate electrical leads may also be used, in which case the read head 100 is formed in contact with layers of electrically conducting lead material, such as tantalum, gold, Ru, Rh or copper, that are in contact with the shields S1, S2.

Figure 4:
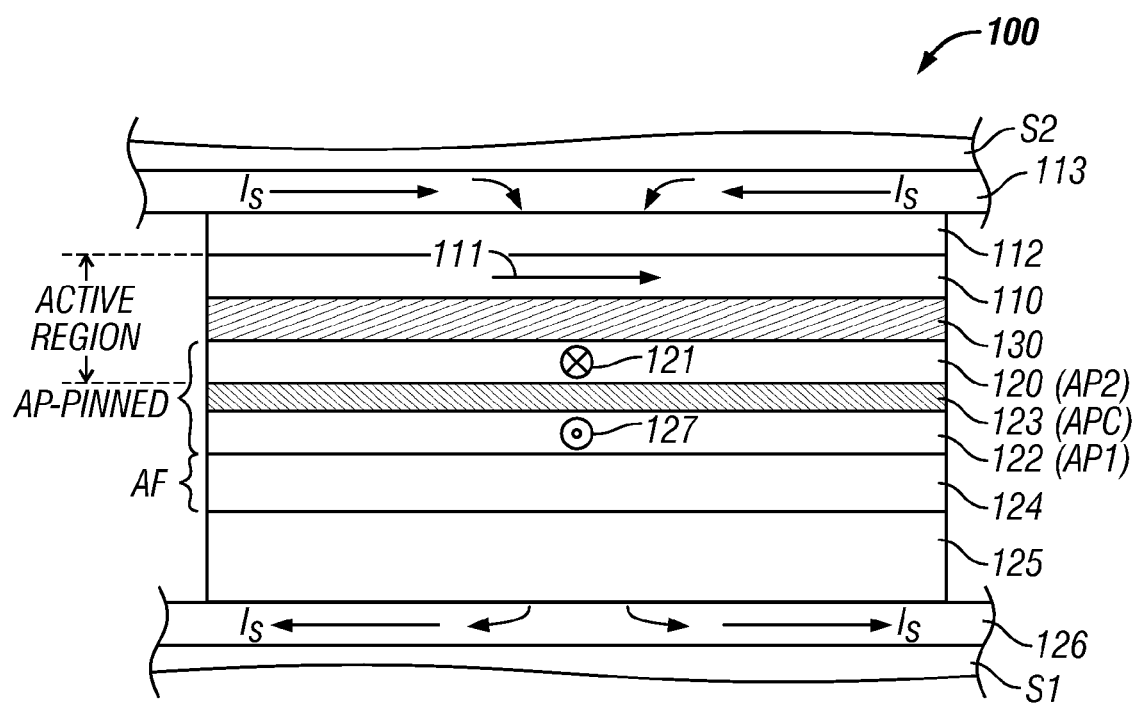
FIG. 4 is a cross-sectional schematic view facing the air-bearing surface (ABS) of a CPP read head showing the stack of layers located between the magnetic shield layers.

FIG. 4 is an enlarged sectional view showing the layers making up sensor 100 as seen from the air bearing surface (ABS) of the sensor. Sensor 100 is a CPP read head comprising a stack of layers formed between the two magnetic shield layers S1, S2 that are typically electroplated NiFe alloy films. The lower shield S1 is typically polished by chemical-mechanical polishing (CMP) to provide a smooth substrate for the growth of the sensor stack. This may leave an oxide coating which can be removed with a mild etch just prior to sensor deposition. The sensor layers include a reference ferromagnetic layer 120 having a fixed magnetic moment or magnetization direction 121 oriented substantially perpendicular to the ABS (into the page), a free ferromagnetic layer 110 having a magnetic moment or magnetization direction 111 that is oriented substantially parallel to the ABS and that can rotate in the plane of layer 110 in response to transverse external magnetic fields from the disk 12, and a nonmagnetic spacer layer 130 between the reference layer 120 and free layer 110. If the spacer layer is an electrically conducting spacer layer, typically formed of copper (Cu), then the CPP sensor is a CPP-SV sensor. If the spacer layer is an electrically insulating spacer layer, typically formed of a material like $TiO_2$, MgO or $Al_2O_3$, then the CPP sensor is a CPP-TMR sensor.

The fixed or pinned ferromagnetic layer in a CPP sensor may be a single pinned layer or an antiparallel (AP) pinned structure. An AP-pinned structure has first (AP1) and second (AP2) ferromagnetic layers separated by a nonmagnetic antiparallel coupling (APC) layer with the magnetization directions of the two AP-pinned ferromagnetic layers oriented substantially antiparallel. The AP2 layer, which is in contact with the nonmagnetic APC layer on one side and the sensor's electrically conducting spacer layer spacer layer on the other side, is typically referred to as the reference layer. The AP1 layer, which is typically in contact with an antiferromagnetic or hard magnet pinning layer on one side and the nonmagnetic APC layer on the other side, is typically referred to as the pinned layer. The AP-pinned structure minimizes the net magnetostatic coupling between the reference/pinned layers and the CPP free ferromagnetic layer. The AP-pinned structure, also called a "laminated" pinned layer, and sometimes called a synthetic antiferromagnet (SAF), is described in U.S. Pat. No. 5,465,185.

The pinned layer structure in the CPP sensor in FIG. 4 is an AP-pinned structure with reference ferromagnetic layer 120 (AP2) and a lower ferromagnetic layer 122 (AP1) that are antiferromagnetically coupled across an AP coupling (APC) layer 123. The APC layer 123 is typically Ru, Ir, Rh, Cr or alloys thereof. The free ferromagnetic layer 110, spacer layer 130 and AP2 layer 120 together make up what is call the "active region" of the sensor. The AP1 and AP2 ferromagnetic layers have their respective magnetization directions 127, 121 oriented antiparallel. The AP1 layer 122 may have its magnetization direction pinned by being exchange-coupled to an antiferromagnetic (AF) layer 124 as shown in FIG. 4. Alternatively, the AP-pinned structure may be "self-pinned" or it may be pinned by a hard magnetic layer such as $Co_{100-x}Pt_x$ or $Co_{100-x-y}Pt_xCr_y$ (where x is about between 8 and 30 atomic percent). In a "self pinned" sensor the AP1 and AP2 layer magnetization directions 127, 121 are typically set generally perpendicular to the disk surface by magnetostriction and the residual stress that exists within the fabricated sensor. It is desirable that the AP1 and AP2 layers have similar moments. This assures that the net magnetic moment of the AP-pinned structure is small so that magneto-static coupling to the free layer is minimized and the effective pinning field of the AF layer 124, which is approximately inversely proportional to the net magnetization of the AP-pinned structure, remains high. In the case of a hard magnetic pinning layer, the hard magnetic pinning layer moment needs to be accounted for when balancing the moments of AP1 and AP2 to minimize magneto-static coupling to the free layer.

Located between the lower shield layer S1 and the AP-pinned structure are the bottom electrical lead 126 and a seed layer 125. The seed layer 125 may be a single layer or multiple layers of different materials. Located between the free ferromagnetic layer 110 and the upper shield layer S2 are a capping layer 112 and the top electrical lead 113. The capping layer 112 may be a single layer or multiple layers of different materials, such as a Cu/Ru/Ta trilayer.

In the presence of an external magnetic field in the range of interest, i.e., magnetic fields from recorded data on the disk 12, the magnetization direction 111 of free layer 110 will rotate while the magnetization direction 121 of reference layer 120 will remain substantially fixed and not rotate. The rotation of the free-layer magnetization 111 relative to the reference-layer magnetization 121 results in a change in electrical resistance. Hence, when a sense direct current $I_S$ is applied between top lead 113 and bottom lead 126, the resistance change is detected as a voltage signal proportional to the strength of the magnetic signal fields from the recorded data on the disk.

The leads 126, 113 are typically Ta or Rh. However, a lower resistance material may also be used. They are optional and used to adjust the shield-to-shield spacing. If the leads 126 and 113 are not present, the bottom and top shields S1 and S2 are used as leads. The seed layer 125 is typically one or more layers of NiFeCr, NiFe, Ta, Cu or Ru. The AF layer 124 is typically a Mn alloy, e.g., PtMn, NiMn, FeMn, IrMn, IrMnCr, PdMn, PtPdMn or RhMn. If a hard magnetic layer is used instead of an AF layer it is typically a CoPt or FePt alloy, for example CoPtCr. The capping layer 112 provides corrosion protection and is typically formed of Ru or Ta.

The ferromagnetic layers 122 (AP1), 120 (AP2), and 110 (free layer) are typically formed of an alloy from the group of Co, Fe, and Ni, such as CoFe or NiFe alloys, or a multilayer of these materials, such as a CoFe/NiFe bilayer. The AP2 layer can also be a laminated structure to obtain a high degree of spin-dependent interface scattering. For example the AP2 layer can be a FM/XX/FM/ . . . /XX/FM laminate, where the ferromagnetic (FM) layers are formed of Co, Fe or Ni, one of their alloys, or a multilayer of these materials, such as a CoFe—NiFe—CoFe trilayer; and the XX layers are nonmagnetic layers, typically Cu, Ag, or Au or their alloys, and are thin enough that the adjacent FM layers are strongly ferromagnetically coupled.

For example, AP2 layer 120 may be a CoFe alloy, typically 10 to 30 Å thick, and the free ferromagnetic layer 110 may be a bilayer of a CoFe alloy, typically about 5-15 Å thick and formed on the spacer layer 130, with a NiFe alloy, typically 10-30 Å thick, formed on the CoFe layer of the bilayer. The APC layer in the AP-pinned structure is typically Ru or Ir with a thickness between about 4-10 Å.

If the AP-pinned structure is the "self-pinned" type, then no pinning layer is required. In a self-pinned structure where no antiferromagnet or hard magnet pinning layer is present, the AP1 layer is in contact with a seed layer on the sensor substrate.

A hard magnetic bias layer (not shown), such as a CoPt or CoCrPt layer, may also be included outside the sensor stack near the side edges of the free ferromagnetic layer 110 or in the stack for magnetic stabilization or longitudinal biasing of the free ferromagnetic layer 110.

One or more of the free layer 110, the AP2 layer 120, the capping layer 112 and the conductive nonmagnetic spacer layer 130 may also include a nano-oxide layer (NOL) to locally confine the current path and increase the effective resistance of the active region. A CoFe NOL may be formed, for example, by interrupting the deposition after some CoFe has been deposited somewhere in the free layer, the AP2 layer, the capping layer, or the conductive spacer layer and oxidizing its surface for several minutes in an $O_2$ or $O_2$/Ar gas at 0.1-10 Torr. NOLs can be formed by oxidizing other materials, e.g., Cu/Al or Cu/Ti alloys or multilayers.

While the read head 100 shown in FIG. 4 is a "bottom-pinned" read head because the AP-pinned structure is below the free layer 110, the free layer 110 can be located below the AP-pinned structure. In such an arrangement the layers of the AP-pinned structure are reversed, with the AP2 layer 120 on top of and in contact with the spacer layer 130.

Figure 5:
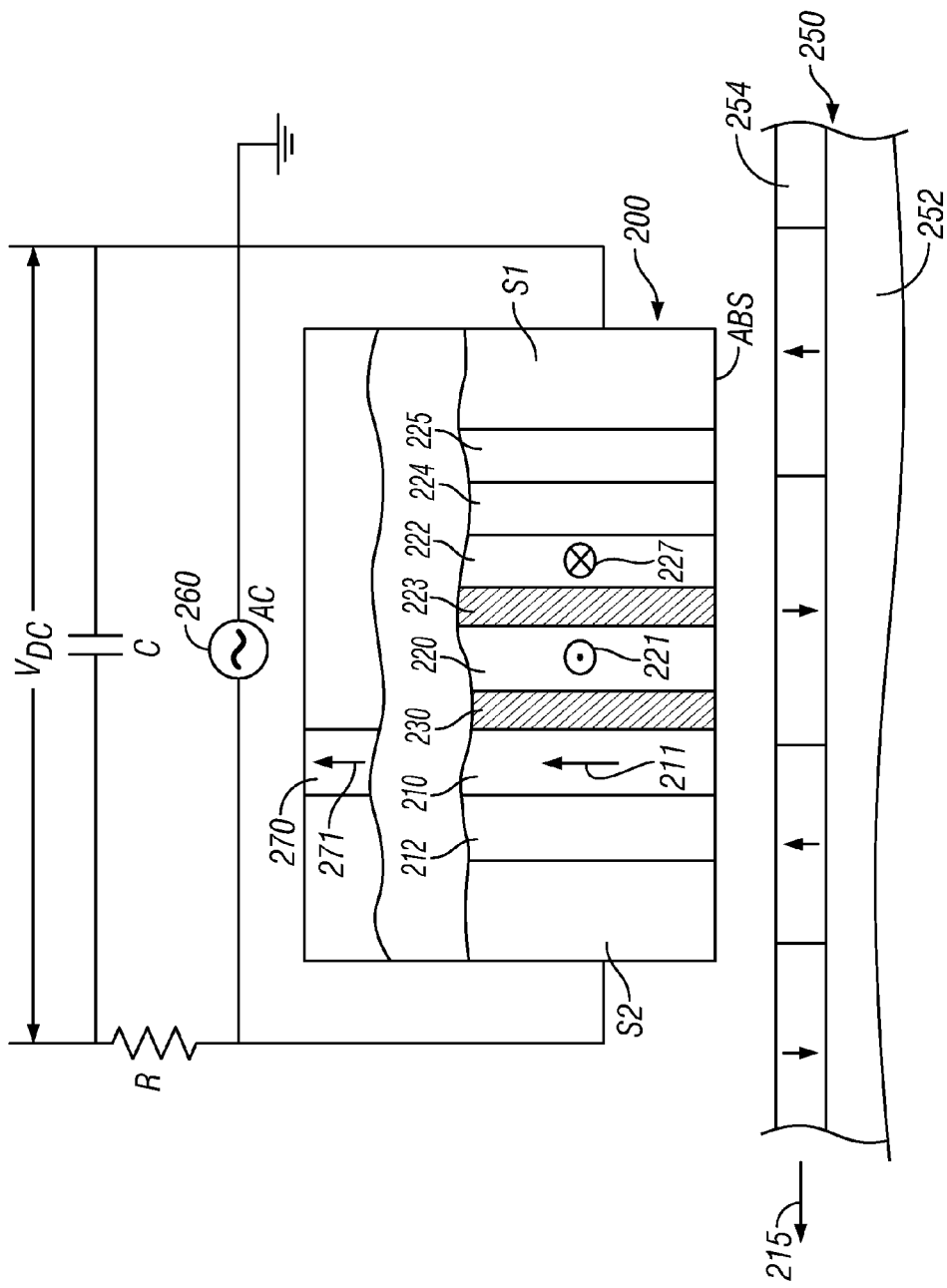
FIG. 5 is a schematic of a magnetic field sensing system according to an embodiment of the invention in a magnetic recording disk drive implementation.

FIG. 5 is a schematic of a magnetic field sensing system according to an embodiment of the invention. The system is illustrated as a magnetic recording disk drive with a sensor 200 with its ABS facing the disk 250. The disk 250 has a substrate 252 and a recording layer 254 that serves as the magnetic recording medium with magnetized regions depicted by the arrows directed toward or away from the ABS. As the disk rotates, the magnetized regions move in the direction of arrow 215 past the sensor 200. The recording layer 254 is depicted as a perpendicular magnetic recording medium with the regions magnetized perpendicularly to the plane of recording layer 254, but alternatively it may be a longitudinal magnetic recording medium with the regions being magnetized in the plane of recording layer 254.

The sensor 200 in FIG. 5 is substantially similar to the previously-described CPP sensor 100 in FIG. 4, with the items numbered in the 200s corresponding to the items numbered in the 100s in sensor 100 of FIG. 4. The sensor 200 may be a CPP GMR-SV type of sensor or a CPP TMR-SV type of sensor. Thus the pinned layer structure in the CPP sensor 200 in FIG. 5 is an AP-pinned structure, like that described in FIG. 4, with reference ferromagnetic layer 220 and ferromagnetic layer 222 that are antiferromagnetically coupled across antiparallel coupling (APC) layer 223. The ferromagnetic layers 220, 222 have their respective magnetization directions 221, 227 oriented antiparallel. The ferromagnetic layer 222 has its magnetization direction pinned by being exchange-coupled to antiferromagnetic (AF) layer 224. The AF layer 224 is grown on seed layer 225.

However, in the previously-described conventional data-reading system that uses the conventional CPP sensor 100, there is a bias or sense direct current ($I_S$) applied to the CPP sensor and this current is at a level less than the critical current ($I_C$) to assure there is no spin-torque affecting the magnetization of the free layer. In a conventional CPP sensor, spin-torque excitations and excessive noise are created if the DC current is too high, i.e., greater than $I_C$. The DC-current induced spin-torque effect may be complex, i.e., several modes can be excited and spin-torque excitations may be induced in more layers than just the free layer, for example in the pinned layer.

A phenomenon related to the spin-torque effect is the spin-torque diode effect, as described by Tulpurkar et al., "Spin-torque diode effect in magnetic tunnel junctions", Nature, Vol. 438-17, November 2005, 339-42. The application of a small radio-frequency alternating current (AC) to a magnetic tunnel junction (MTJ) device can generate a measurable direct-current (DC) voltage across the device when the frequency of the AC current is about the resonant frequency of the free layer. Assume the free and reference layer magnetizations are in the film plane and are oriented at an angle $\Theta$ with respect to each other. The AC passing through the stack of layers in the MTJ device exerts a torque on the free layer magnetization, rotating it towards the pinned layer magnetization during one half of the AC cycle, typically the negative half of the AC where electron current flows from the reference to the free layer. This configuration has low resistance. During the next half of the AC cycle, i.e., the positive half where electron current flows from the free to the reference layer, the free layer magnetization is rotated in the opposite direction away from the reference layer, which is the high resistance state. In a small frequency window around the free layer resonance frequency the change in resistance follows the AC, with some phase lag, at the same frequency. This results in a DC output voltage, which is proportional to the AC current. The frequency window around the free layer resonance frequency can be tuned effectively by an external magnetic field and scales as the real part of the complex expression:

$$V_{DC} = \frac{1}{4}\Delta R \sin^2(\Theta) I_{AC} \text{Re}\left(\frac{if\gamma' ST - \gamma'^2 H_d FT}{(f_0^2 - f^2) - if\alpha\gamma' H_d}\right) = \qquad \text{Eq. (1)}$$

$$-\frac{1}{4}\Delta R \sin^2(\Theta) I_{AC} \gamma'^2 H_d \frac{f^2 \alpha ST + (f_0^2 - f^2) FT}{(f_0^2 - f^2)^2 + f^2 \alpha^2 \gamma'^2 H_d^2}$$

where ST is the usual anti-damping like spin-torque and FT is the field-like spin-torque term, $I_{AC}$ is the amplitude of the AC, $\gamma'=\gamma/2\pi$, where $\gamma$ is the gyromagnetic constant, $\alpha$ is the damping constant of the free layer, $H_d$ is the demagnetization field perpendicular to the free layer plane, $f_0$ is the resonance frequency of the free layer, $f$ is the alternating current frequency, and $\Theta$ is the time averaged angle between the reference layer and free layer. In Eq. (1) the resonance frequency $f_0$ and thus $V_{DC}$ depends on the magnitude of the external magnetic field.

In the system of FIG. 5, unlike the conventional CPP sensor and system described above and shown in FIGS. 1-4, an alternating-current (AC) source 260 operates at a fixed selected frequency and directs AC perpendicularly through the layers of CPP sensor 200, with the AC amplitude $I_{AC}$ being high enough to deliberately induce a spin-torque in the free layer 210. The AC-induced spin-torque at the selected frequency causes oscillations in the magnetization of the free layer 210 that give rise to a direct current (DC) voltage signal $V_{DC}$ as described above. It is believed that AC-induced spin-torque oscillations avoid the problems associated with DC-induced spin-torque excitations that may occur in conventional CPP sensors. Because the AC source 260 operates at a fixed, selected frequency, only one mode of oscillation is excited and this mode can be chosen by proper selection of the AC frequency. Because the resonance frequencies of the free layer and pinned layer (or reference layer if an AP-pinned structure is used) are typically far enough apart, if the AC frequency is selected to be near the resonance frequency of the free layer, then there will be no oscillations induced in the pinned layer. Thus the DC voltage signal $V_{DC}$ is a direct result of only the oscillations induced in the free layer. Assume that the sensor as depicted in FIG. 5 is a TMR-like sensor that utilizes an insulating tunnel barrier as the spacer layer 230. Then the preferred in-plane magnetization 221 of the reference layer 220 as depicted is substantially parallel to the ABS. In the absence of an alternating current from AC source 260 the in-plane magnetization 211 of the free layer 210 as depicted is substantially perpendicular to the ABS (substantially orthogonal to the reference layer magnetization). This alignment maximizes the $\sin^2(\Theta)$ term and the DC output voltage accordingly. Other angles of $\Theta$ can be chosen with the in-plane magnetization 211 of the free layer 210 still kept substantially perpendicular to the ABS and the in-plane magnetization 221 of the reference layer 220 rotated accordingly. However angles of $\Theta$ too close to zero need to be avoided as they will minimize the DC output voltage. Thus a range for $\Theta$ of about 30<$\Theta$<120 degrees is preferred. In the presence of an alternating current above $I_C$ from AC source 260, the magnetization 211 of free layer 210 will oscillate back and forth relative to the magnetization 221 of the reference layer 220 and this will produce $V_{DC}$. As explained below, the value of $V_{DC}$ will change in response to the magnitude of the external magnetic field being sensed and as the free layer is driven in and out of resonance with the AC.

If instead of a TMR-like sensor with a tunnel barrier a metallic GMR-like sensor with a metallic spacer like Cu is used as the spacer layer 230, the preferred angle between the reference layer magnetization 221 and the free layer magnetization 211 would be closer to antiparallel than parallel (90<$\Theta$<180 degrees). This is due to the Slonczewski term (see J. C. Slonczewski, JMMM 159, L1 (1996) and N. Smith et al. IEEE Trans. Magn. 41, 2935 (2005)) which expresses the different angular dependence of the magnetoresistance for CPP-GMR sensors compared to CPP-TMR sensors. The above Eq. (1) for the DC voltage of a CPP-GMR like sensor then would include the Slonczewski term.

In the CPP sensor of this invention, the DC voltage resulting from AC-induced spin-torque oscillations of the free layer magnetization represents the actual magnetoresistive signal, whereas in a conventional CPP sensor the DC-induced spin-torque oscillations add noise to the magnetoresistive signal. Thus here the oscillations of free layer magnetization are desirable.

The changes of the DC voltage $V_{DC}$ across the sensor resulting from the AC-induced spin-torque oscillations are measured and are directly related to changes in the external magnetic field on the sensor 200. In this example the magnetic fields being sensed are the fields from the recorded bit pattern magnetizations in recording layer 254 of disk 250.

The frequency of the AC from source 260 applied to sensor 200 is chosen to be near the resonance frequency of the free layer 210 in the absence of a magnetic field, which can easily be determined by a ferromagnetic resonance experiment. A typical and desirable resonance frequency for this application would be in the 2-10 GHz range. A typical data-rate in a modern disk drive system is about 0.5 to 1 GHz. Accordingly, the upper frequency at which the DC voltage signal changes is about 0.5 to 1 GHz. Thus, an electronic low-pass filter, as exemplified by a resistor R and capacitor C in FIG. 5, separates the AC driving the sensor from the rapidly changing $V_{DC}$ signal level that changes with each bit transition.

Figure 6:
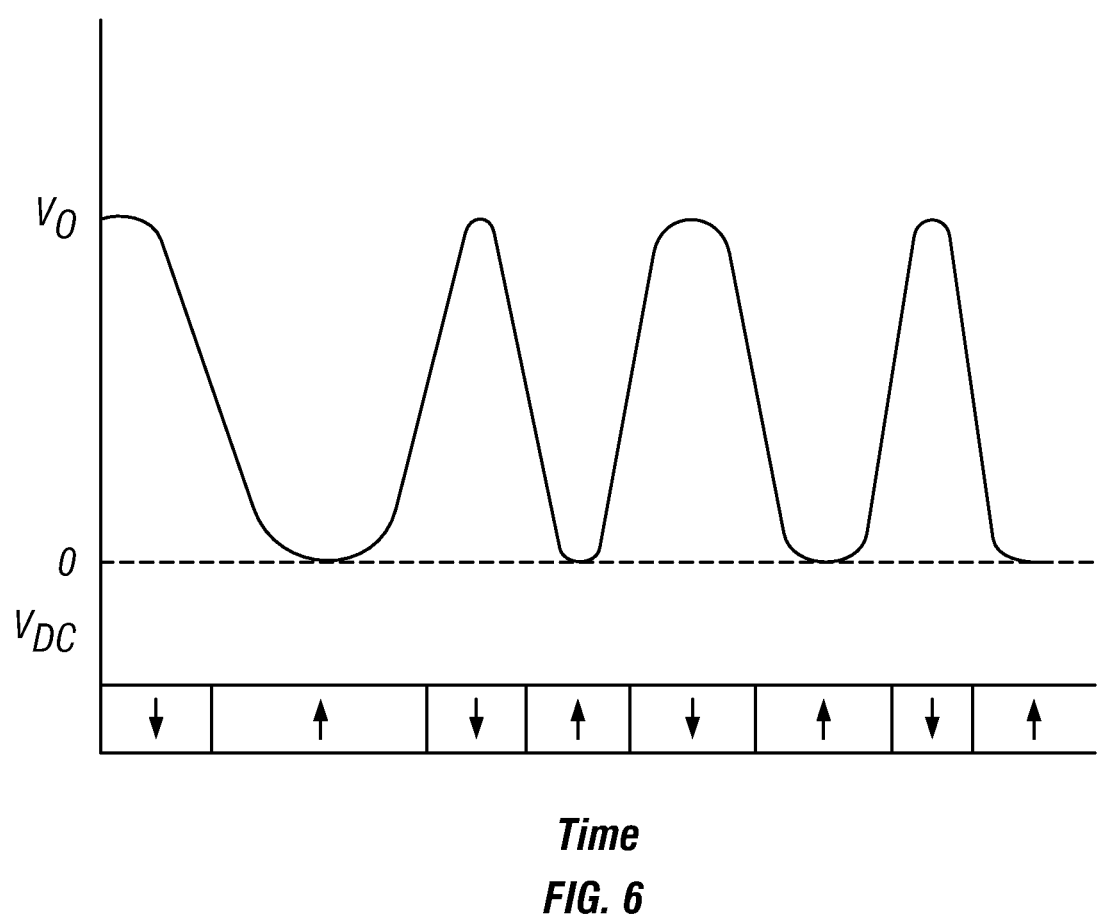
FIG. 6 is a graph showing how $V_{DC}$ across the CPP sensor responds to applied magnetic fields from different recorded magnetizations in the recording layer.

The peak current value from the AC current source 260 should be above the critical current threshold $I_C$ of the CPP sensor 200 at which spin-torque oscillations are induced. Thus the current density should be higher than $10^6$ A/cm$^2$, preferably in the range of about $10^6$-$10^8$ A/cm$^2$. While a minimum current density is required to cause spin-torque excitations, a too high current density may induce physical breakdown of the sensor, for example by electromigration. In the absence of an applied magnetic field on the sensor 200, this level of AC would result in a $V_{DC}$ of about 10-1000 μV. In a magnetic recording disk drive implementation, the magnetic fields from the recording layer 254 will be in the range of about −250 to +250 Oe. The resonance frequency of the free layer, however, will change with the magnitude of the external fields, not the sign of the external fields. For this reason, in a disk drive implementation where the magnetic fields being sensed have positive and negative values, an external bias field of at least the value of the magnetic field from a magnetized region of the recording layer 254, e.g., 250 Oe, is required so that the sensor 200 senses the magnetic transitions in the range of about 0 to 500 Oe. A bias field can be provided by means of a hard magnet in the back of the sensor on the side opposite the ABS. This is shown in FIG. 5 by hard magnet 270, which can be for example a layer of a CoPt alloy, in the back of sensor 200 behind the free layer 210. The hard magnet layer 270 produces an external magnetic bias field, represented by arrow 271, on the free layer 210 that is oriented orthogonal to the ABS of the sensor, thus being able to add or subtract from the magnetic fields from the bits. Assume that the AC drives the sensor at the resonance frequency of the free layer in the absence of a magnetic field. When the sensor scans over a magnetic "down" bit the net magnetic field on the sensor is about zero, since the bias field 271 (assume +250 Oe) and a recorded magnetic "down" bit (assume −250 Oe) cancel each other. The resulting DC voltage is $V_{DC}=V_0$, for example about 100 μV. When the sensor scans over a magnetic "up" bit the magnetic field from the "up" bit (assume +250 Oe) adds to the bias field 271, thus the net magnetic field on the sensor is enough to change the free layer resonance frequency so that it is out of resonance with the AC. The resulting DC voltage then is about $V_{DC}=0$. Thus, as the disk 250 moves past sensor 200, the $V_{DC}$ will change from about 0 μV (at about +500 Oe and out of resonance with the AC) to about 100 μV (at about 0 Oe and in resonance with the AC). FIG. 6 is a graph showing how $V_{DC}$ varies as the sensor 200 responds to magnetic fields from different recorded "up" and "down" magnetizations (the 0 and 1 bits) in the recording layer 254. The $V_{DC}$ is an analog signal representative of data recorded on the disk and can be detected by any conventional voltage detector. This signal can be converted to digital data signals using well-known techniques and circuit components used in conventional read channels for magnetic recording disk drives.

Because in the present invention it is necessary that the sensor 200 operates at current levels above $I_C$ to induce the spin-torque effect in the free layer 210, the properties of the materials used for the free layer in the CPP sensor can be chosen to reduce $I_C$, and thus reduce the level of current that needs to be supplied by AC source 260. The critical current is given generally by the following:

$$I_C=(\alpha/g)M_s t(H_k+2\pi M_s), \qquad \text{Eq. (2)}$$

where α is the damping parameter, g is a parameter that depends on the spin-polarization of the ferromagnetic material, $M_s$ is the saturation magnetization and t the thickness of the free layer, and $H_k$ is the anisotropy field of the free layer. The product $M_s$*t is determined by the flux from the recorded bits on the disk and is typically given in terms of equivalent thicknesses of NiFe alloy, for example 40 Å equivalent of permalloy (~800 emu/cm$^3$). Thus a free layer material with desirable values for the parameters α, $M_s$, and $H_k$ can be selected to minimize $I_C$. For example, $Ni_{81}Fe_{19}$ exhibits a low α of about 0.01 to 0.02, low $M_s$*t of about 800 emu/cm$^3$ and low intrinsic anisotropy field $H_k$ of about 1 Oe.

Also, high spin-polarization materials will decrease $I_C$ significantly by increasing the value of the parameter g, which depends on the spin-polarization of the ferromagnetic material. Thus the free ferromagnetic layer 210 may be formed of or comprise a ferromagnetic Heusler alloy, some of which are known to exhibit high spin-polarization in their bulk form. Full and half Heusler alloys are intermetallics with particular composition and crystal structure. Examples of Heusler alloys include but are not limited to the full Heusler alloys $Co_2MnX$ (where X is one or more of Al, Sb, Si, Sn, Ga, or Ge), $Co_2FeSi$, and $Co_2Fe_xCr_{(1-x)}Al$ (where x is between 0 and 1). Examples also include but are not limited to the half Heusler alloys NiMnSb, and PtMnSb. A perfect Heusler alloy will have 100% spin-polarization. However it is possible that in a thin-film form and at finite temperatures, the band structure of the Heusler alloy may deviate from its optimal structure and that the spin polarization will decrease. For example, some alloys may exhibit chemical site disorder and crystallize in the B2 structure instead of the $L2_1$ Heusler structure. Nevertheless, the spin polarization may exceed that of conventional ferromagnetic alloys. Thus, as used herein a "Heusler alloy" shall mean an alloy with a composition substantially the same as that of a known Heusler alloy, and which results in enhanced spin polarization compared to conventional ferromagnetic materials such as NiFe and CoFe alloys.

Another class of materials that can be used are those with short spin-diffusion length comparable to the thickness of a typical free layer. Similar to materials with high spin-polarization they are effective in scattering spins over a short length scale and thus induce spin-torque instabilities. One such preferred material has a composition of $(Co_xFe_{100-x})_{(100-y)}M_y$, where M is an element selected from the group consisting of Al, Ge and Si and where x is between about 40 and 60 and y is between about 20 and 40. These materials have the advantage of reasonably high spin-polarization and low magnetic damping, which is desirable in the sensor of this invention to reduce $I_C$.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic field sensing system comprising:
a magnetic field sensor comprising
a substrate;
a pinned ferromagnetic layer having an in-plane magnetization direction;
a free ferromagnetic layer lying in a plane parallel to the plane of the pinned layer and having an in-plane magnetization direction, in the absence of an external magnetic field to be sensed, oriented greater than 90 degrees and less than 180 degrees from the in-plane magnetization direction of the pinned layer, the free ferromagnetic layer being substantially free to rotate in the presence of an external magnetic field to be sensed and exhibiting magnetization oscillations in response to an electrical current greater than a critical current perpendicularly through the free ferromagnetic layer, said magnetization oscillations having a resonance frequency in response to an alternating current; and
an electrically conductive nonmagnetic spacer layer between the pinned and free layers;
a hard magnet for applying a magnetic bias field to the free layer to bias the magnetization direction of the free layer in said orientation relative to the magnetization direction of the pinned layer;
one and only one electrical current source coupled to the sensor, said current source directing alternating current at a fixed frequency substantially at said resonance frequency perpendicularly through the layers of the sensor; and
a voltage detector coupled to the sensor for detecting the direct-current voltage across the sensor in response solely to the alternating current, the detected voltage being a direct measure of external magnetic fields during the application of alternating current at said fixed frequency, the voltage detector being capable of detecting magnetic fields in opposite directions to one another.

2. The sensor of claim 1 wherein the free ferromagnetic layer has a composition of $(Co_xFe_{100-x})_{(100-y)}M_y$, where M is an element selected from the group consisting of Al, Ge and Si and where x is between about 40 and 60 and y is between about 20 and 40.

3. The sensor of claim 1 wherein the free ferromagnetic layer comprises a ferromagnetic Heusler alloy selected from the group consisting of $Co_2MnX$ (where X is selected from the group consisting of Al, Sb, Si, Sn, Ga, and Ge), NiMnSb, PtMnSb, $Co_2FeSi$, and $Co_2Fe_xCr_{(1-x)}Al$ (where x is between 0 and 1).

4. The sensor of claim 1 further comprising:
an antiparallel (AP) pinned structure comprising a first AP-pinned (AP1) ferromagnetic layer having an in-plane magnetization direction, a second AP-pinned (AP2) ferromagnetic layer having an in-plane magnetization direction substantially antiparallel to the magnetization direction of the AP1 layer, and an AP coupling (APC) layer between and in contact with the AP1 and AP2 layers, wherein the AP2 layer comprises said pinned layer.

5. The sensor of claim 1 wherein the sensor is a read sensor for sensing recorded magnetization regions on a magnetic recording disk, the magnetization regions providing external magnetic fields of opposite polarity to the sensor, the read sensor having an air-bearing surface (ABS) for facing the magnetization regions on the disk, and wherein the free layer magnetization is substantially perpendicular to the ABS in the absence of external magnetic fields from the disk.

6. A magnetic recording disk drive comprising:
a rotatable magnetic recording disk having magnetized regions providing magnetic fields of opposite polarity to one another, the transitions between magnetized regions representing recorded data;
a read sensor for detecting the magnetic fields from the magnetized regions on the disk, the read sensor having a disk-facing surface and comprising
a substrate;
a pinned ferromagnetic layer having an in-plane magnetization;
a free ferromagnetic layer lying in a plane parallel to the plane of the pinned layer and having an in-plane magnetization direction, in the absence of magnetic fields from the magnetized regions on the disk, oriented greater than 30 degrees and less than 120 degrees from the in-plane magnetization direction of the pinned layer, the free ferromagnetic layer being substantially free to rotate in the presence of magnetic fields from the magnetized regions on the disk, the free ferromagnetic layer having a resonance frequency of magnetization oscillations in response to an alternating current (AC); and
a nonmagnetic spacer layer formed of an electrically insulating material between the pinned and free layers;
one and only one electrical current source coupled to the read sensor, the current source directing AC perpendicularly through the layers of the read sensor at a fixed frequency substantially at said resonance frequency;
a layer of hard magnetic material for applying a magnetic bias field to the free ferromagnetic layer to bias the magnetization direction of the free layer in said orientation relative to the magnetization direction of the pinned layer; and
a voltage detector coupled to the read sensor for detecting the direct-current (DC) voltage across the sensor in response solely to the AC, the detected voltage being a direct measure of the magnetized regions of opposite polarity on the disk as the magnetized regions move past the read sensor as the disk rotates.

7. The disk drive of claim 6 wherein the magnetic bias field is at least as great as the magnetic field from a magnetized region of the disk.

8. The disk drive of claim 6 wherein the magnetized regions of the disk are magnetized in a direction generally perpendicular to the surface of the disk and the magnetic bias field is oriented generally perpendicular to the surface of the disk.

9. The disk drive of claim 6 wherein the in-plane magnetization directions of the read sensor's free and pinned ferromagnetic layers are substantially orthogonal to one another in the absence of an AC and in the absence of magnetized regions.

10. The disk drive of claim 6 wherein the read sensor's free ferromagnetic layer has a composition of $(Co_xFe_{100-x})_{(100-y)}M_y$, where M is an element selected from the group consisting of Al, Ge and Si and where x is between about 40 and 60 and y is between about 20 and 40.

11. The disk drive of claim 6 wherein the read sensor's free ferromagnetic layer comprises a ferromagnetic Heusler alloy selected from the group consisting of $Co_2MnX$ (where X is selected from the group consisting of Al, Sb, Si, Sn, Ga, and Ge), $Co_2FeSi$, NiMnSb, PtMnSb, and $Co_2Fe_xCr_{(1-x)}Al$ (where x is between 0 and 1).

12. The disk drive of claim 6 wherein the free layer magnetization is substantially perpendicular to the read sensor's disk-facing surface in the absence of magnetic fields from the disk.

13. The disk drive of claim 6 further comprising:
an antiparallel (AP) pinned structure comprising a first AP-pinned (AP1) ferromagnetic layer having an in-plane magnetization direction, a second AP-pinned (AP2) ferromagnetic layer having an in-plane magnetization direction substantially antiparallel to the magnetization direction of the AP1 layer, and an AP coupling (APC) layer between and in contact with the AP1 and AP2 layers, wherein the AP2 layer comprises said pinned layer.

14. The disk drive of claim 6 wherein the current source provides AC at a current density in the range of about $10^6$ to $10^7$ A/cm$^2$.

\* \* \* \* \*